(12) United States Patent
Cassagne

(10) Patent No.: US 6,336,817 B1
(45) Date of Patent: Jan. 8, 2002

(54) ELEMENT ENABLING ELECTRICAL OR ELECTRONIC TEST ASSEMBLIES TO BE ACHIEVED

(76) Inventor: Gilles Cassagne, le Jacelin, pre Rampeau, 73470 Novalaise (FR)

( * ) Notice: Subject to any disclaimer, the term of this patent is extended or adjusted under 35 U.S.C. 154(b) by 0 days.

(21) Appl. No.: 09/497,148

(22) Filed: Feb. 3, 2000

(51) Int. Cl.$^7$ ................................................. H01R 9/09
(52) U.S. Cl. ................................... 439/76.1; 174/128 J
(58) Field of Search .............................. 439/76.1, 395, 439/76; 174/260, 138 G, 138 H, 138 J

(56) References Cited

U.S. PATENT DOCUMENTS

| | | | |
|---|---|---|---|
| 4,862,076 A | * | 8/1989 | Renner et al. ................. 439/68 |
| 5,091,826 A | * | 2/1992 | Arnett et al. ................. 439/76 |
| 5,420,920 A | * | 5/1995 | Capper et al. ................. 439/97 |
| 5,971,812 A | * | 10/1999 | Martin ......................... 439/676 |
| 6,186,826 B1 | * | 2/2001 | Weikle ......................... 439/536 |
| 6,194,656 B1 | * | 2/2001 | Kondo et al. ................. 174/52.1 |

FOREIGN PATENT DOCUMENTS

| | | |
|---|---|---|
| FR | 70 438 | 5/1959 |
| FR | 1 532 325 A | 11/1968 |
| WO | WO 97/19499 | 5/1997 |

* cited by examiner

*Primary Examiner*—Brian Sircus
*Assistant Examiner*—Thanh-Tam Le
(74) *Attorney, Agent, or Firm*—Oliff & Berridge, PLC

(57) ABSTRACT

A support made of insulating material which carries a component or a group of components. Connection terminals are electrically connected to the ends of the component, each of these terminals comprising a slot opening out into one of its edges, able to receive and secure one or more conducting wires, so as to establish an electrical connection. A plate comprises at least two conducting filaments integrated in said plate, and recesses arranged at the level of the ends of these filaments, enabling the ends of the component and the terminals to be soldered, creating an electrical connection between the component and the terminals.

3 Claims, 1 Drawing Sheet

ELEMENT ENABLING ELECTRICAL OR ELECTRONIC TEST ASSEMBLIES TO BE ACHIEVED

BACKGROUND OF THE INVENTION

The present invention relates to an element enabling electrical or electronic test assemblies to be achieved.

Such test assemblies are traditionally achieved on test plates of different types such as plates called "plates to be soldered", "plates to be wrapped", "integrated circuit plates" or "plates with connectors".

These plates have the shortcomings of not being very flexible to use and of requiring a very long time for the different components to be fitted thereon.

SUMMARY OF THE INVENTION

The object of the present invention is to remedy these shortcomings.

For this purpose, the element to which the invention relates comprises:

an electrical or electronic component, or a group of such components electrically or electronically connected to one another, connection terminals electrically connected to the ends of the component or group of components, each of these terminals comprising one or more slots opening out into one of its edges, able to receive and secure one or more conducting wires so as to establish an electrical connection, a plate comprising at least two conducting filaments integrated therein and recesses arranged at the level of the ends of these filaments, and a support made of insulating material, to which support said component or group of components, said plate and said terminals are secured.

This support made of insulating material enables an electrical or electronic component or a group of such components to be handled easily and without risk of damage. The connection terminals which are connected to an electrical or electronic component or a group of such components enable this component or group of components to be connected easily and quickly, by simple insertion of one or more conducting wires in the slots comprised therein, to other similar elements comprising other components or group of components.

Elements according to the invention can thus be easily and quickly connected or separated to enable different types of assemblies to be successively achieved, or to modify an existing assembly, as the user requires.

In addition, achieving an assembly according to a diagram, originating for example from an electrical or electronics magazine, is rendered easier since the arrangement of the components in space can be preserved.

Each terminal is preferably presented in the form of a metal blade. The edges of this blade which confine the slot or slots are relatively sharp and thus enable an unbared conducting wire to be inserted into one of the slots, said edges cutting the sheath away when this insertion is performed to make the electrical connection.

Each terminal advantageously comprises one or more appreciably V-shaped or W-shaped notch or notches, one end of the slot opening out into the bottom of this notch or notches. This notch thus forms an inlet making it easy to insert the conducting wire into the slot.

Each element preferably comprises indications printed on the support made of insulating material for ease of marking, arrangement, and connection of the polarized components, transistors or other components. In addition, this support can have a particular coloring constituting in itself information relative to the components which it comprises, in particular as far as the type of components (resistors, capacitors, connectors, etc.) is concerned. Marking and arrangement of the different elements are thus facilitated.

Each element preferably comprises pins enabling said element to be assembled on a plate (for example a plexiglass plate) drilled to the diameter of said pins and according to the distance separating the latter.

According to one embodiment of the invention, the component or group of components is previously arranged on a plate comprising at least two conducting filaments integrated therein and recesses arranged at the level of the ends of these filaments enabling soldering of the ends of the component or group of components and of the terminals creating an electrical connection between the component or group of components and the terminals. The plate, the ends of the component or group of components and the bottom parts of the terminals connected thereto are then sunk in a support made of synthetic material, leaving the upper parts of the terminals comprising said slots free.

BRIEF DESCRIPTION OF THE DRAWINGS

In order to be fully understood, the invention is again described hereafter, with reference to the figures representing, as a non-restrictive example only, an element to which the invention relates.

DESCRIPTION OF A PREFERRED EMBODIMENT

Figure 1A:
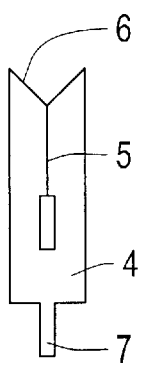
FIGS. 1A and 1B represent a view of the connection terminal (4) of an element (1), before said element is manufactured.

According to the invention the element (1) comprises a plate (9) comprising conducting filaments (10) integrated in said plate, and recesses (11) are arranged at the level of the ends of these filaments (10), in the plate (9), to enable the studs (7) of the connection terminals (4) and the ends (3) of a resistor (2) to be soldered, thus creating an electrical connection between said studs and said resistor.

Figure 1B:
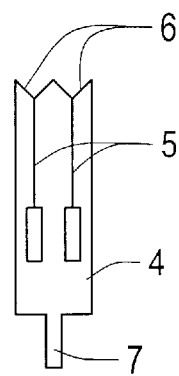
Figure 2A:
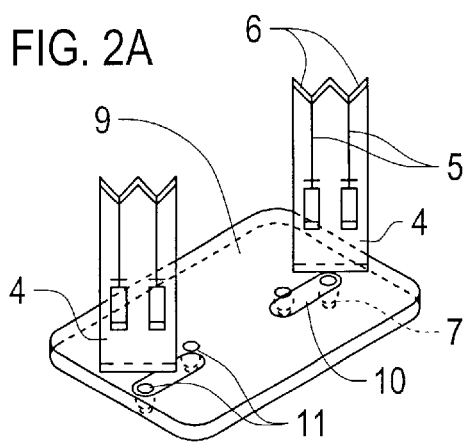
FIGS. 2A and 2B represent a perspective view of a plate (9) and of the conducting filaments (10), before said element is manufactured.
Figure 2B:
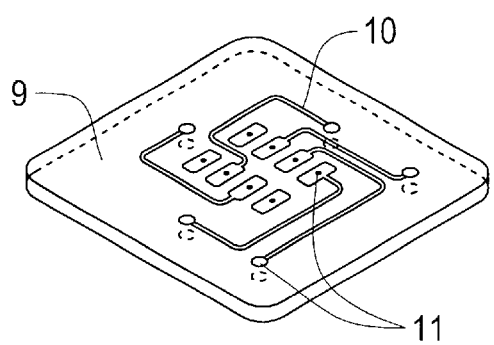

Each terminal (4) is formed by a metal blade. As can be seen particularly in FIGS. 1A and 1B, it comprises one or more slots (5) opening out into one of its longitudinal edges, and one or more V-shaped or W-shaped upper notches (6), into the bottom of which the ends of the slots (5) open out. In its part opposite to the notch (6), the terminal (4) comprises a stud (7) enabling the plate (9) to be inserted in the recesses (11) and soldered onto the conducting filaments (10).

Figure 3:
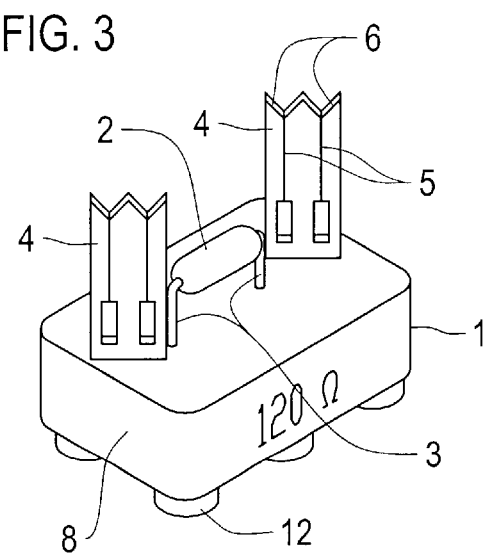
FIGS. 3 and 4 represent an element (1) enabling electrical and electronic test assemblies to be achieved.
Figure 4:
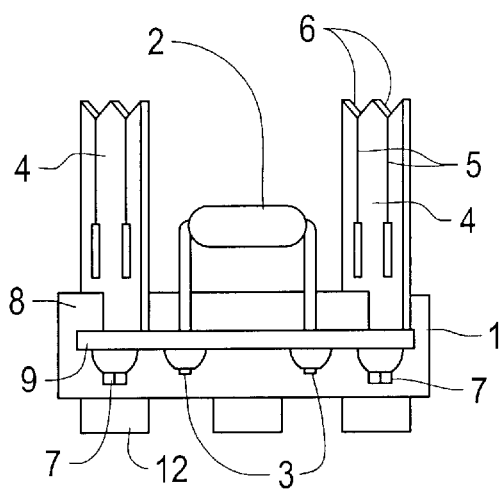

As shown in FIGS. 3 and 4, the ends (3) of the resistor (2), the studs (7) of the terminals (4) and the plate (9) to which they are soldered are sunk in a support (8). This support (8) is made of insulating material, in particular a molded synthetic resin. This support (8) moreover comprises pins (12) enabling the element (1) to be assembled on a base-plate which is not represented.

Each slot (5) is able to receive one or more conducting wires (not represented) forcibly inserted therein. The edges of the terminal (4) which confine this slot (5) are relatively sharp and thus enable the insulating sheath of the conducting wire to be cut away.

This slot (5) thus enables a conducting wire to be received and held so as to easily and quickly establish an electrical connection of the resistor (2) with other elements comprising other components or groups of components. The notch (6) constitutes an inlet which facilitates insertion of one or more conducting wires into the slot (5).

The element (1) according to the invention can be easily handled without any risk of damage to the resistor (2), so that a test assembly can be easily constituted or disassembled, so as to successively achieve different types of assemblies or to modify these assemblies, as the user requires.

What is claimed is:

1. An element (1) enabling electrical or electronic test assemblies to be achieved comprising:
   an electrical or electronic component (2), or a group of such components electrically or electronically connected to one another,
   connection terminals (4) electrically connected to the component (2) or group of components, each terminal (4) comprising a slot (5) opening for receiving and securing one or more conducting wires so as to establish an electrical connection,
   a plate (9) comprising at least two conducting filaments (10) integrated in said plate and recesses (11) arranged at the level of ends of said filaments enabling ends (3) of the component (2) or group of components and the terminals (4) to be soldered, and
   a support (8) made of insulating material, to which support said component or group of components, said plate and said terminals are secured, said support comprising assembly pins 12, wherein the support is formed by a block of molded synthetic material, in which the ends (3) of the component (2) or group of components and the lower parts of the terminals (4) connected thereto are sunk, and leaving the upper parts of the terminals (4) comprising aid slots free.

2. The element according to claim 1, wherein each terminal (4) is presented in the form of a metal blade comprising one or more appreciably V-shaped or W-shaped notches (6), the ends of the slots (5) opening out into the bottom of these notches.

3. The element according to claim 1, wherein the support (8) has a particular coloring constituting in itself information relative to the components comprised by said support.

* * * * *